United States Patent [19]
Wolf et al.

[11] Patent Number: 5,596,617
[45] Date of Patent: Jan. 21, 1997

[54] FEEDBACK SHIFT REGISTER FOR GENERATING DIGITAL SIGNALS REPRESENTING SERIES OF PSEUDO-RANDOM NUMBERS

[75] Inventors: Andreas Wolf; Hans W. Ahrweiler, both of Berlin, Germany

[73] Assignee: Siemens Aktiengesellschaft, Munich, Germany

[21] Appl. No.: 495,493

[22] PCT Filed: Jan. 26, 1994

[86] PCT No.: PCT/DE94/00091

§ 371 Date: Sep. 12, 1995

§ 102(e) Date: Sep. 12, 1995

[87] PCT Pub. No.: WO94/17591

PCT Pub. Date: Aug. 4, 1994

[30] Foreign Application Priority Data

Jan. 27, 1993 [DE] Germany .......................... 43 02 830.6

[51] Int. Cl.$^6$ .................................................. H03K 3/84
[52] U.S. Cl. ............................. 377/73; 377/81; 327/164
[58] Field of Search .................... 377/81, 73; 327/164

[56] References Cited

U.S. PATENT DOCUMENTS 3,715,508  2/1973  Blasbalg ........................ 179/15 BC
3,751,648  8/1973  Wu .................................. 235/152
3,984,668  10/1976  Zetterberg et al. ............. 235/152
5,289,518  2/1994  Nakao .............................. 377/81

FOREIGN PATENT DOCUMENTS 2734302  2/1979  Germany.

OTHER PUBLICATIONS

IEEE Proceedings/Computers and Digital Techniques, Jan. 1988, UK, 135 No. 1, Part E, pp. 67–69: *Generators for Sequences with Near–Maximal Linear Equivalence*.
A. Wolf: "*Messtechnik für das BISDN*", VDE–Verlag GmbH, Berlin, pp. 72–75.
U. Tietze et al.: *Halbleiter–Schaltungstechnik*, Springer–Verlag, Berlin, DE, 1976, pp. 590–593.

*Primary Examiner*—Margaret Rose Wambach
*Attorney, Agent, or Firm*— Kenyon & Kenyon

[57] ABSTRACT

A feedback shift register for generating digital signals representing pseudo-random number sequences has n-stages and exclusive OR-circuits in the feedback logic, as well as a clock-pulse generator. To be able to generate digital signals, which are well suited for a further digital processing, the clock-pulse generator (17) is linked with the n-stages (11, 12, 13, 14, 15) of the shift register (10) via a controllable gate circuit (18), which blocks one clock pulse of $2^n$ clock pulses (CLK) of the clock-pulse generator (17) in each case.

6 Claims, 4 Drawing Sheets

| | | | $i_1$ | $i_2$ | $i_3$ | $i_4$ | $i_5$ |
|---|---|---|---|---|---|---|---|
| $X^0$ | mod | $G_{KKF}(X)$ | 1 | 0 | 0 | 0 | 0 |
| $X^1$ | mod | $G_{KKF}(X)$ | 0 | 1 | 0 | 0 | 0 |
| $X^2$ | mod | $G_{KKF}(X)$ | 0 | 0 | 1 | 0 | 0 |
| $X^3$ | mod | $G_{KKF}(X)$ | 0 | 0 | 0 | 1 | 0 |
| $X^4$ | mod | $G_{KKF}(X)$ | 0 | 0 | 0 | 0 | 1 |
| $X^5$ | mod | $G_{KKF}(X)$ | 1 | 0 | 1 | 0 | 0 |
| $X^6$ | mod | $G_{KKF}(X)$ | 0 | 1 | 0 | 1 | 0 |
| $X^7$ | mod | $G_{KKF}(X)$ | 0 | 0 | 1 | 0 | 1 |
| $X^8$ | mod | $G_{KKF}(X)$ | 1 | 0 | 1 | 1 | 0 |
| $X^9$ | mod | $G_{KKF}(X)$ | 0 | 1 | 0 | 1 | 1 |
| $X^{10}$ | mod | $G_{KKF}(X)$ | 1 | 0 | 0 | 0 | 1 |
| $X^{11}$ | mod | $G_{KKF}(X)$ | 1 | 1 | 1 | 0 | 0 |
| $X^{12}$ | mod | $G_{KKF}(X)$ | 0 | 1 | 1 | 1 | 0 |
| $X^{13}$ | mod | $G_{KKF}(X)$ | 0 | 0 | 1 | 1 | 1 |
| $X^{14}$ | mod | $G_{KKF}(X)$ | 1 | 0 | 1 | 1 | 1 |
| $X^{15}$ | mod | $G_{KKF}(X)$ | 1 | 1 | 1 | 1 | 1 |
| $X^{16}$ | mod | $G_{KKF}(X)$ | 1 | 1 | 0 | 1 | 1 |
| $X^{17}$ | mod | $G_{KKF}(X)$ | 1 | 1 | 0 | 0 | 1 |
| $X^{18}$ | mod | $G_{KKF}(X)$ | 1 | 1 | 0 | 0 | 0 |
| $X^{19}$ | mod | $G_{KKF}(X)$ | 0 | 1 | 1 | 0 | 0 |
| $X^{20}$ | mod | $G_{KKF}(X)$ | 0 | 0 | 1 | 1 | 0 |
| $X^{21}$ | mod | $G_{KKF}(X)$ | 0 | 0 | 0 | 1 | 1 |
| $X^{22}$ | mod | $G_{KKF}(X)$ | 1 | 0 | 1 | 0 | 1 |
| $X^{23}$ | mod | $G_{KKF}(X)$ | 1 | 1 | 1 | 1 | 0 |
| $X^{24}$ | mod | $G_{KKF}(X)$ | 0 | 1 | 1 | 1 | 1 |
| $X^{25}$ | mod | $G_{KKF}(X)$ | 1 | 0 | 0 | 1 | 1 |
| $X^{26}$ | mod | $G_{KKF}(X)$ | 1 | 1 | 1 | 0 | 1 |
| $X^{27}$ | mod | $G_{KKF}(X)$ | 1 | 1 | 0 | 1 | 0 |
| $X^{28}$ | mod | $G_{KKF}(X)$ | 0 | 1 | 1 | 0 | 1 |
| $X^{29}$ | mod | $G_{KKF}(X)$ | 1 | 0 | 0 | 1 | 0 |
| $X^{30}$ | mod | $G_{KKF}(X)$ | 0 | 1 | 0 | 0 | 1 |
| $X^{31}$ | mod | $G_{KKF}(X)$ | 1 | 0 | 0 | 0 | $0 = X^0$ |

FIG. 2

|  |  |  | $i_1$ | $i_2$ | $i_3$ | $i_4$ | $i_5$ |
|---|---|---|---|---|---|---|---|
| $x^0$ | mod | $G_{KKF}(x)$ | 1 | 0 | 0 | 0 | 0 |
| $x^1$ | mod | $G_{KKF}(x)$ | 0 | 1 | 0 | 0 | 0 |
| $x^1$ | mod | $G_{KKF}(x)$ | 0 | 1 | 0 | 0 | 0 |
| $x^2$ | mod | $G_{KKF}(x)$ | 0 | 0 | 1 | 0 | 0 |
| $x^3$ | mod | $G_{KKF}(x)$ | 0 | 0 | 0 | 1 | 0 |
| $x^4$ | mod | $G_{KKF}(x)$ | 0 | 0 | 0 | 0 | 1 |
| $x^5$ | mod | $G_{KKF}(x)$ | 1 | 0 | 1 | 0 | 0 |
| $x^6$ | mod | $G_{KKF}(x)$ | 0 | 1 | 0 | 1 | 0 |
| $x^7$ | mod | $G_{KKF}(x)$ | 0 | 0 | 1 | 0 | 1 |
| $x^8$ | mod | $G_{KKF}(x)$ | 1 | 0 | 0 | 1 | 0 |
| $x^9$ | mod | $G_{KKF}(x)$ | 0 | 1 | 0 | 1 | 1 |
| $x^{10}$ | mod | $G_{KKF}(x)$ | 1 | 0 | 0 | 0 | 1 |
| $x^{11}$ | mod | $G_{KKF}(x)$ | 1 | 1 | 1 | 0 | 0 |
| $x^{12}$ | mod | $G_{KKF}(x)$ | 0 | 1 | 1 | 1 | 0 |
| $x^{13}$ | mod | $G_{KKF}(x)$ | 0 | 0 | 1 | 1 | 1 |
| $x^{14}$ | mod | $G_{KKF}(x)$ | 1 | 0 | 1 | 1 | 1 |
| $x^{15}$ | mod | $G_{KKF}(x)$ | 1 | 1 | 1 | 1 | 1 |
| $x^{16}$ | mod | $G_{KKF}(x)$ | 1 | 1 | 0 | 1 | 1 |
| $x^{17}$ | mod | $G_{KKF}(x)$ | 1 | 1 | 0 | 0 | 1 |
| $x^{18}$ | mod | $G_{KKF}(x)$ | 1 | 1 | 0 | 0 | 0 |
| $x^{19}$ | mod | $G_{KKF}(x)$ | 0 | 1 | 1 | 0 | 0 |
| $x^{20}$ | mod | $G_{KKF}(x)$ | 0 | 0 | 1 | 1 | 0 |
| $x^{21}$ | mod | $G_{KKF}(x)$ | 0 | 0 | 0 | 1 | 1 |
| $x^{22}$ | mod | $G_{KKF}(x)$ | 1 | 0 | 1 | 0 | 1 |
| $x^{23}$ | mod | $G_{KKF}(x)$ | 1 | 1 | 1 | 1 | 0 |
| $x^{24}$ | mod | $G_{KKF}(x)$ | 0 | 1 | 1 | 1 | 1 |
| $x^{25}$ | mod | $G_{KKF}(x)$ | 1 | 0 | 0 | 1 | 1 |
| $x^{26}$ | mod | $G_{KKF}(x)$ | 1 | 1 | 1 | 0 | 1 |
| $x^{27}$ | mod | $G_{KKF}(x)$ | 1 | 1 | 0 | 1 | 0 |
| $x^{28}$ | mod | $G_{KKF}(x)$ | 0 | 1 | 1 | 0 | 1 |
| $x^{29}$ | mod | $G_{KKF}(x)$ | 1 | 0 | 0 | 1 | 0 |
| $x^{30}$ | mod | $G_{KKF}(x)$ | 0 | 1 | 0 | 0 | 1 |
| $x^{31}$ | mod | $G_{KKF}(x)$ | 1 | 0 | 0 | 0 | 0 = $x^0$ |

FIG 5

FEEDBACK SHIFT REGISTER FOR GENERATING DIGITAL SIGNALS REPRESENTING SERIES OF PSEUDO-RANDOM NUMBERS

BACKGROUND OF THE INVENTION

The present invention relates to a feedback shift register for generating digital signals representing pseudo-random number sequences comprising n-stages and exclusive OR-circuits in the feedback logic, as well as comprising a clock-pulse generator.

A. Wolf "Meβtechnik für das BISDN" [Measuring Technique for the BISDN], VDE Publishers, 1992, pp. 72–75 or U. Tietze/Ch. Schenk "Halbleiter-Schaltungstechnik" [Semiconductor Circuit Engineering], Springer Publishers 1976, pp. 590–593 disclose one such feedback shift register. FIG. 1 depicts a known shift register 1 of this type that includes five stages 2, 3, 4, 5 and 6, each constituted by for example, a D-flip-flop. As is apparent from FIG. 1, the shift register 1 goes through a feedback loop, an exclusive OR-gate 7 being arranged between the stages 3 and 4. The operation of this register can be expressed by the following generator polynomial $G_{KKF}(x)$:

$$G_{KKF}(x) = x^0 + x^2 + x^5 = x^5 + x^2 + 1 \tag{1}$$

This generator polynomial $G_{KKF}(x)$ is a so-called irreducible polynomial with the degree $g=5$; the period of a $2^5$-m-sequence able to be generated with it as a pseudo-random number sequence amounts to $2^g - 1 = 31$.

For the sake of having a simplest possible description, neither the clock-pulse generator common to all stages nor the customary blocking protection are depicted in the case of the known shift register shown in FIG. 1. In the case of the known shift register, all stages receive the same clock signal, through which means the contents $i_1(x) \cdot x^0$, $i_2(x) \cdot x^1$, etc. of the individual stages 2 through 6 change with every clock signal. The contents of the individual stages can be expressed by the polynomial $I(x)$ indicated in the following equation (2):

$$I(x) = x^4 \cdot i_5 + x^3 \cdot i_4 + x^2 \cdot i_3 + x^1 \cdot i_2 + x^0 \cdot i_1 \tag{2}$$

Here, the state in which all stages have a "0" contents is excluded.

In a generally known manner, the contents of the shift register make up the rows of a binary Galois field, and can generally be expressed by the following relation (3)

$$x^i \bmod G_{KKF}(x), \tag{3}$$

when a "1" is input for $i=0$ in the first stage ($x^0$). The states depicted in FIG. 2 result then for the contents of the stages 2 through 6 when a shift register in accordance with FIG. 1 is used. From $x^{31}$ on, the states of the individual stages 2 through 6 repeat themselves because of the period of 31 of the $2^5$-m-sequence. One obtains the $2^5$-m-sequence as a binary sequence of numbers:

$$c_0(n) = \{0000100101100111110001101110101\}, \tag{4}$$

which is identical to the contents of the stage 6.

An inadequacy of the digital signals produced with the known shift register is that they have a period of $2^n - 1$ where n denotes the number of stages of the shift register. Thus in the case of the depicted $2^5$-m-sequence the period duration is 31. Therefore, the thus generated digital signals are not easily suited for further digital processing using customary digital measured-value processing devices. This is true, for example, when a fast Fourier transform is supposed to be made, for which it is a condition that the data record has $2^n$ values.

SUMMARY OF THE INVENTION

The present invention proposes a feedback shift register for generating digital signals representing pseudo-random number sequences, which always supply a full data record $2^n$ regardless of the number of its n-stages.

In the case of a feedback shift register of the type according to the invention indicated at the outset, this objective is achieved in that the clock-pulse generator is linked with the n-stages via a controllable gate circuit, which blocks one clock pulse of $2^n$ clock pulses of the clock-pulse generator in each case.

An essential advantage of the shift register according to the invention consists in that as the result of the blocking or suppressing of one clock pulse from a series of $2^n$ clock pulses of the clock-pulse generator in each case, the shift register is not clocked further for one pulse of the clock pulse generator, so that the stages of the shift register do not change their state for this one clock pulse; as a result, the generated digital signals are extended by one bit and the thus acquired pseudo-random number sequence or the thus acquired digital signals have a period duration of 32, when the consideration is based on a 5-stage register. In the case of a 4-stage shift register, a period duration of 16 would result, when one proceeds in accordance with the invention. The spectrum of such an extended sequence is only marginally changed compared to a sequence that has not been extended, so that in terms of measurement techniques, no adverse influences arise in the processing of such digital signals. It should also be mentioned—as already revealed by the above explanations—that the invention is not limited to irreducible polynomials of the 5th degree.

In the case of the shift register according to the invention, the controllable gate circuit can be designed in different ways, as long as it permits one out of the $2^n$ clock pulses of the clock pulse generator to be gated in each case. It is considered to be advantageous for the controllable gate circuit to contain a gate element having two inputs, whose one input is linked to the clock-pulse generator, and whose other input is linked to a control circuit, and for the control circuit to block the gate element by emitting a control signal in each case during $2^n$ clock pulses for the duration of one clock pulse. This can be achieved, for example, by means of a counting circuit, which is acted upon by the clock-pulse generator.

To achieve the least complex possible circuit engineering, it is deemed especially advantageous for the control circuit to be made up of a digital circuit module that is connected on the input side to the n-stages of the shift register and, given a preselected contents of these stages, for it to generate the control signal, and for the output of the digital circuit module to be connected to the other input of the gate element.

In the case of the shift register according to the invention, the gate element can be constituted quite simply in terms of circuit engineering by an AND gate.

BRIEF DESCRIPTION OF THE DRAWINGS

FIG. 2 illustrates the various states for the shift register of FIG. 1.

FIG. 5 illustrates a list in tabular form of the states of the stage contents of the shift register according to FIG. 3.

DETAILED DESCRIPTION

Figure 1:
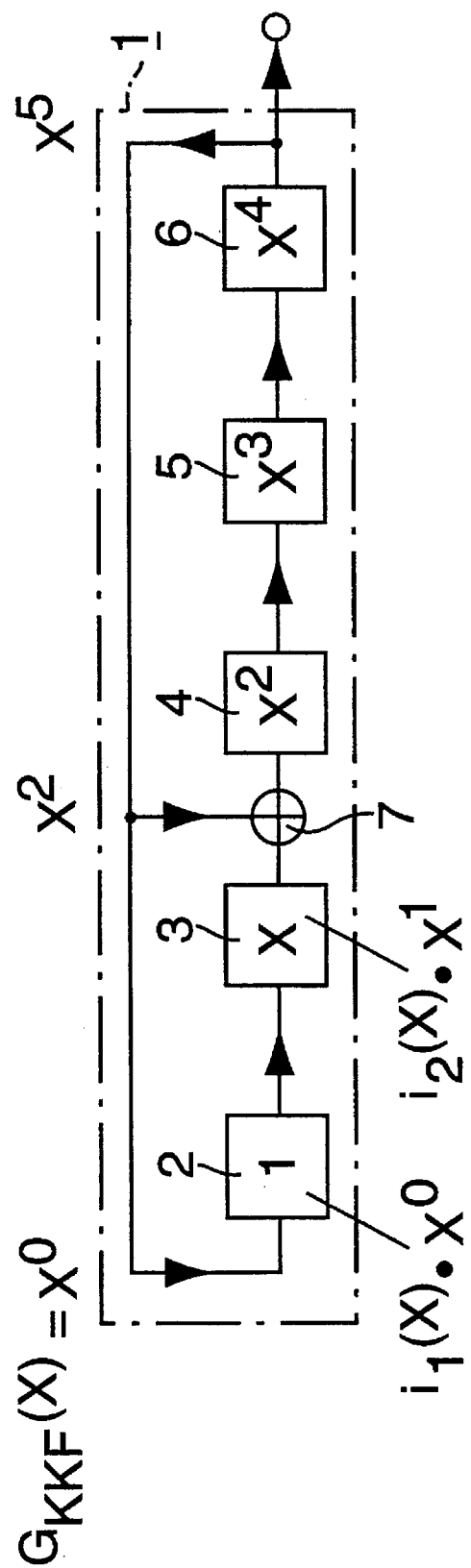
FIG. 1 illustrates a known shift register arrangement.
Figures 3, 4:
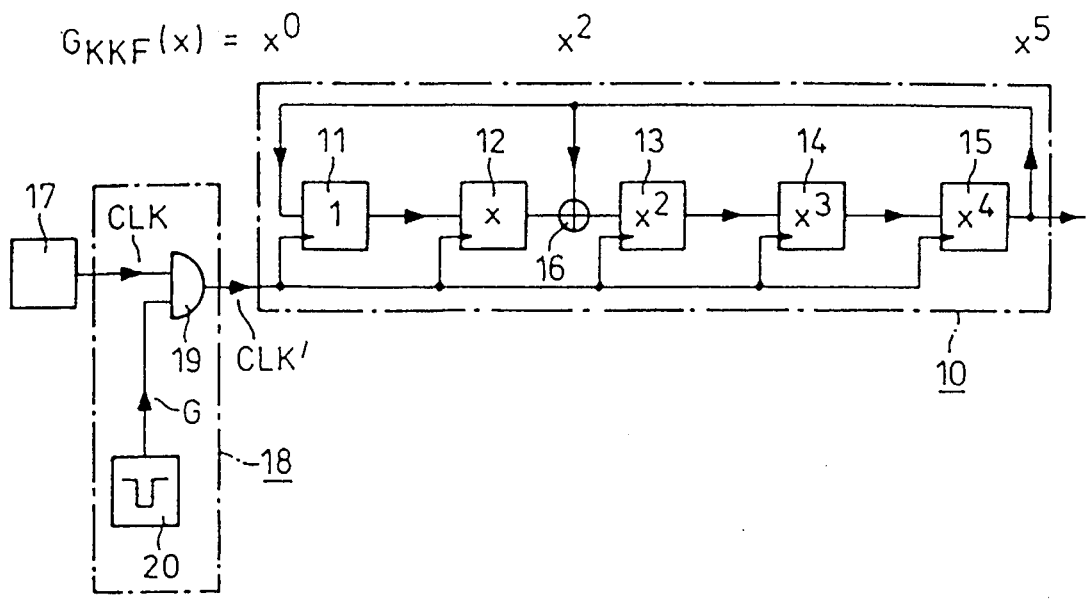
FIG. 3 is an example of a shift register according to an embodiment of the invention.
FIG. 4 illustrates a representation of the pulses occurring in the embodiment of FIG. 3.

The structure of the shift register 10 depicted in FIG. 3 corresponds to that of FIG. 1 in so far as it is likewise provided with five stages 11, 12, 13, 14 and 15, a feedback via an exclusive OR gate 16 taking place here as well. Assigned here as well to the shift register 10 is a clock-pulse generator 17, which, however, is not connected directly to the clock inputs of the individual stages 11 through 15 of the shift register 10, but rather via a controllable gate circuit 18. The clock-pulse generator 17 emits clock pulses CLK. In the depicted exemplary embodiment, the gate circuit 18 is a control circuit that has a gate element 19 designed as an AND gate and a pulse generator 20. This pulse generator 20 can be designed as a counting circuit, which is linked directly with the clock-pulse generator 17 and which, given a defined counter content, emits an output signal as a control signal G. However, the control circuit can also be comprised of a digital circuit module, which is connected to the stages of the shift register 10 and which emits the control signal G at a defined state of these stages.

As FIG. 4 shows, following a freely specifiable, but definite number of pulses CLK from the clock-pulse generator 17, the pulse generator 20 emits the control signal G, by means of which the AND-gate 19 is blocked for a clock pulse CLK. The clock pulses CLK' occur then at the output of the controllable gate circuit 18. This means that the shift register 10 is not advanced for one clock pulse of the clock pulse generator 17, so that the states of the individual stages of the shift register 10 retain their state for this one clock pulse. The generated $2^5$-m-sequence is consequently extended by 1 bit.

This factual situation is also clearly revealed by FIG. 5, in which the states of the individual stages 11 through 15 of the shift register 10 are depicted—similarly to in FIG. 2 for the known shift register.

The rows 2 and 3 of the table in accordance with FIG. 5 show clearly, namely, that the state $x^1 \bmod G_{KKF}(X)$ is obtained two times, so that a period of 32 results in the case of the depicted 5-stage shift register.

What is claimed is:

1. A circuit for generating digital signals representing pseudo-random sequences comprising:

a feedback shift register including n-stages and exclusive OR-circuits in the feedback logic;

a clock-pulse generator; and a controllable gate circuit linking said clock pulse generator and said feedback shift register and blocking one clock pulse of every $2^n$ clock pulses of the clock-pulse generator.

2. The circuit of claim 1, wherein said controllable gate circuit contains a gate element having two inputs, one said input being linked to the clock-pulse generator, and the other input being linked to a control circuit, said control circuit blocking the gate element by emitting a control signal for the duration of one clock pulse during every $2^n$ clock pulses of the clock-pulse generator.

3. The circuit of claim 2, wherein said control circuit is made up of a digital circuit module, which has an input connected to the n-stages of said shift register and, given a preselected contents of these stages, generates the control signal, and that the output of the digital circuit module is connected to the other input of the gate element.

4. The circuit of claim 1, wherein the gate element is an AND gate.

5. The circuit of claim 2, wherein the gate element is an AND gate.

6. The circuit of claim 3, wherein the gate element is an AND gate.

* * * * *